United States Patent [19]

Goto

[11] Patent Number: 4,939,371
[45] Date of Patent: Jul. 3, 1990

[54] CHARGED PARTICLE BEAM DEVICE

[75] Inventor: Susumo Goto, Hachiohji, Japan

[73] Assignee: Canon Kabushiki Kaisha, Tokyo, Japan

[21] Appl. No.: 170,052

[22] Filed: Mar. 16, 1988

Related U.S. Application Data

[63] Continuation of Ser. No. 828,997, Feb. 13, 1986, abandoned.

[30] Foreign Application Priority Data

Feb. 19, 1985 [JP] Japan ............................ 60-029457

[51] Int. Cl.⁵ ............................................. H01J 3/10
[52] U.S. Cl. ..................................... 250/397; 250/491.1
[58] Field of Search ................. 250/492.21, 491.1, 397

[56] References Cited

U.S. PATENT DOCUMENTS 3,975,640  8/1976  Boux et al. .......................... 250/397
4,321,510  3/1982  Takigawa ............................ 250/397
4,524,277  6/1985  Shimura et al. ................. 250/491.1

Primary Examiner—Bruce C. Anderson
Attorney, Agent, or Firm—Fitzpatrick, Cella, Harper & Scinto

[57] ABSTRACT

A charged-particle beam device for irradiating a predetermined position on an object with a beam of charged particles, the device having an aperture member for restricting the beam of charged-particles from a source, the aperture member being divided into plural segments, and a detecting system for detecting any deviation of the axis of the beam of charged particles on the basis of electric currents produced, from the segments of the aperture member, by impingement of the beam of charged particles upon the segments of the aperture member.

15 Claims, 3 Drawing Sheets

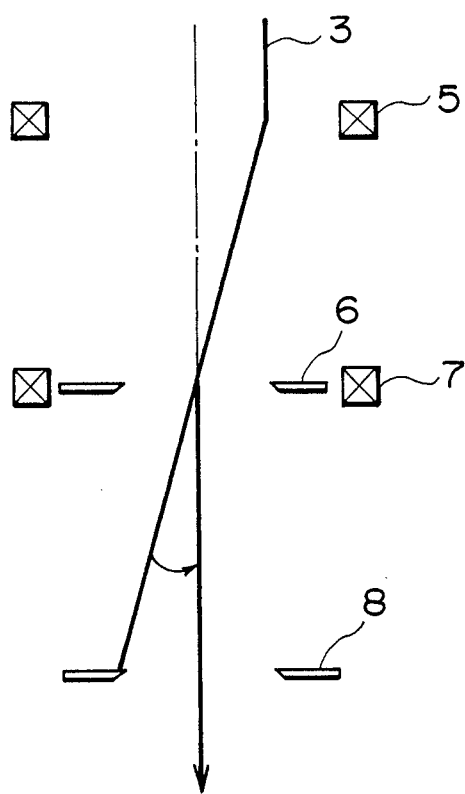
F I G. 3

CHARGED PARTICLE BEAM DEVICE

This application is a continuation of application Ser. No. 828,997 filed 2/13/86, now abandoned.

FIELD OF THE INVENTION AND RELATED ART

This invention relates to a charged-particle beam device using a beam of charged particles. More particularly, the invention is concerned with a charged-particle beam device which is arranged to positively and accurately detect the position of an axis of the beam of charged particles or in which the adjustment or alignment of the axis of the beam of charged particles is automatically effected. The charged-particle beam device of the present invention is effectively usable, e.g., in the field of a semiconductor device manufacturing exposure apparatus using an electron beam.

In charged-particle beam devices using a beam of charged-particles, in general, the beam of charged particles is produced by a charged-particle generating source, and only a central portion of the charged-particle beam having a maximum current density is selected by use of suitable aperture stop means. That selected portion of the charged-particle beam is directed to impinge upon a predetermined position on the surface of a sample or workpiece. In actual charged-particle beam devices, however, mechanical adjustment of the central axis of the charged-particle generating source (such as an electron gun) or an ion gun and the central axis of the aperture means so as to be aligned does not assure complete alignment of the axis of the charged-particle beam with respect to a predetermined axis of the charged-particle beam device. So, it is usually necessary to accurately detect and adjust the axis of the beam of charged particles.

One of known examples for adjusting the axis of the beam of charged particles is such that an electric current caused by such portion of the beam of charged particles from the charged-particle generating source that has passed through the aperture stop means is measured by use of a Faraday cup disposed in the vicinity of the sample and, then, a DC power to be supplied to a deflecting coil device (alignment coil device) for adjusting the position of the axis of the beam is manually controlled so that a predetermined electric current is detected at the Faraday cup. Another example is such that the beam of charged particles is directed to the surface of the sample, and secondary electrons or reflection electrons produced from the point of irradiation on the sample are detected by means of a detector. Similarly, in this example, the axis of the beam of charged particles is adjusted by manually controlling the DC power supply to the deflecting coil device so that the intensity of the detection signal obtainable from the detector becomes maximum.

As described, conventional methods for adjusting the axis of the beam of charged particles require manual operations which are very complicated and time-consuming. Further, the alignment of the axis of the beam of charged particles is not very stable, and there is a possibility that the alignment is deteriorated with an elapse of time. It is therefore necessary to continuously detect or monitor the position of the axis of the beam of charged particles and the amount of irradiation by the charged-particle beam. Also, the necessity of special detector means makes the device bulky, expensive and complicated.

SUMMARY OF THE INVENTION

It is accordingly a primary object of the present invention to provide a charged-particle beam device which is free from the above-described problems peculiar to the prior art and which assures accurate and stable detection of any misalignment or positional deviation of the axis of the beam of charged particles.

It is another object of the present invention to provide a charged-particle beam device by which the alignment of the axis of the beam of charged particles is attainable automatically.

Briefly, according to one aspect of the present invention, there is provided a charged-particle beam device for irradiating a predetermined position on an object with a beam of charged particles, the device having an aperture stop member for restricting the beam of charged particles from a source, the aperture stop member being divided into plural segments, and a detecting system for detecting any deviation of the axis of the beam of charged particles on the basis of electric currents produced, from the segments of the aperture stop member, by impingement of the beam of charged particles upon the segments of the aperture stop member.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 3 is a schematic view showing the manner of correction of deviation of the axis of the beam of charged particles.

DESCRIPTION OF THE PREFERRED EMBODIMENTS

Figure 1:
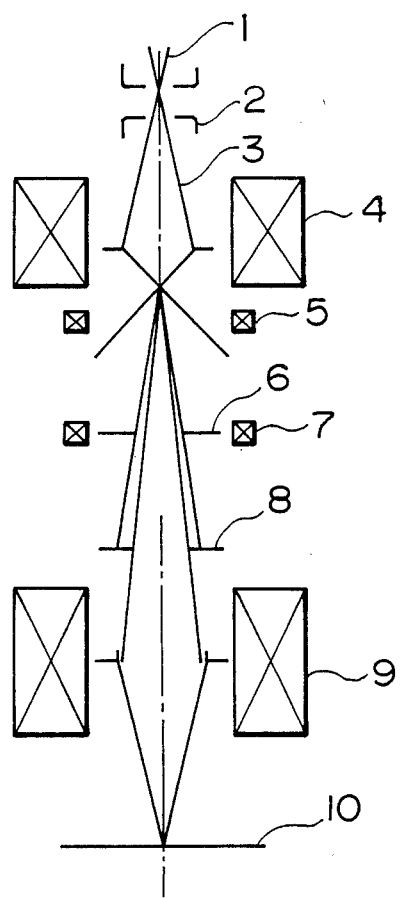
FIG. 1 is a schematic view showing a charged-particle beam concentrating portion of a charged-particle beam device according to one embodiment of the present invention.

Referring first to FIG. 1, there is shown a beam concentrating portion of a charged-particle beam apparatus according to one embodiment of the present invention.

In FIG. 1, a beam 3 of charged particles produced by a charged-particle beam source 1 such as a filament is accelerated by means of an anode 2 and is concentrated by an electron lens (condenser lens) 4. In this example, the electron lens 4 comprises a magnetic-field type deflector. Denoted in FIG. 1 by numerals 6 and 8 are aperture stop members (hereinafter "aperture member") for restricting the beam of charged-particles. In this embodiment, each of the aperture members 6 and 8 is made of an electrically conductive material, for the sake of detection of any deviation of the charged-particle beam 3, as will be described later in more detail. Denoted by numerals 5 and 7 are deflectors which are provided to correct the deviation of the axis of the charged-particle beam 3, also as will be described later. An objective lens 9 is provided to converge the charged-particle beam 3 upon one point on a sample or workpiece 10.

Figure 2:
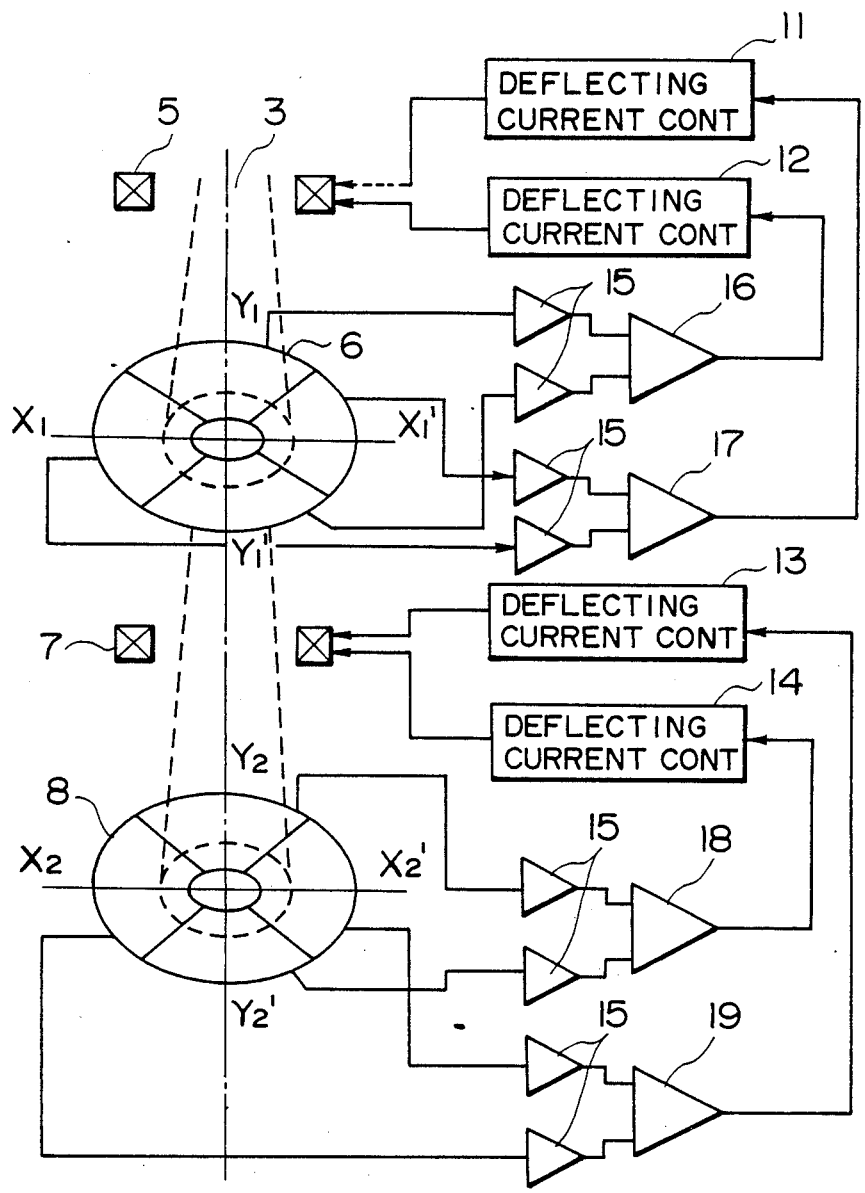
FIG. 2 is a schematic and diagrammatic view of an automatic alignment portion, for the axis of the beam of charged particles, in the device of FIG. 1.

FIG. 2 is an explicatory view of an automatic axis-alignment portion of the apparatus of FIG. 1 and shows the aperture members 6 and 8 and the deflectors 5 and 7 in more detail.

The beam 3 of charged particles as concentrated by the electron lens 4 (FIG. 1) is incident on the aperture member 6 which is divided, in this embodiment, into four fan-shaped segments X1, X1', Y1 and Y1'. These fan-shaped segments X1-Y1' are electrically isolated from each other. Since the aperture member 6 formed by the fan-shaped segments X1-Y1' is made of an electrically conductive material, at least a portion of the charged particles of the beam 3 incident thereon flows into the segments X1-Y1' of the aperture member 6, thereby to produce currents of absorbed electrons. Amplifiers 15—15 are connected to the fan-shaped segments X1-Y1', respectively. Each of the amplifiers 15 is adapted to amplify a minute electric current caused by the charged particles (i.e. the current of absorbed electrons) flown into corresponding one of the segments X1-Y1' of the aperture member 6. Two differential amplifiers 16 and 17 are provided, each of which is connected to corresponding two of the minute-current amplifiers 15—15 and produces a differential signal corresponding to the difference between the output signals applied thereto from the two minute-current amplifiers 15 and 15. More specifically, in this embodiment, the differential amplifier 16 is adapted to produce a differential signal corresponding to the difference between the electric currents provided by the charged particles flown into the fan-shaped segments Y1 and Y1', while the differential amplifier 17 is adapted to produce a differential signal corresponding to the difference between the electric currents provided by the charged particles flown into the fan-shaped segments X1 and X1'. The differential amplifiers 16 and 17 are also connected to deflecting current controlling circuits 12 and 11, respectively. These deflecting current controlling circuits 12 and 11 are adapted to operate, in response to the respective differential signals from the amplifiers 16 and 17, to control driving electric currents to be supplied to the deflector 5, thereby to control the deflecting action of the deflector 5 so that the differential signals to be supplied from the amplifiers 16 and 17 become null (zero).

If, for example, the beam 3 of charged particles impinging on the aperture member 6 contains deviation so that a larger portion of the beam 3 is incident on the fan-shaped segment X1, the electric current of the charged particles flown into the segment X1 becomes greater than that provided by the charged particles flown into the segment X1' opposing to the segment X1. Therefore, the differential amplifier 17 produces, for example, a positive differential signal corresponding to the difference between the currents from the segments X1 and X1'. In accordance with the differential signal from the differential amplifier 17, the deflecting current controlling circuit 11 is operated to control the electric current to be supplied to the deflector 5, to control the deflecting action of the deflector 5 so as to deflect the beam 3 of charged particles in a direction more toward the segment X1' of the aperture member 6, rather than the segment X1, by a degree equalizing the amounts of incidence of the charged particles upon the segments X1 and X1' and thus causing the differential amplifier 17 to output a null or zero differential-signal. By this, the axis of the beam 3 of charged particles is aligned with the center of the aperture member 6 in the direction of the segments X1 and X1'. Also, with respect to the direction of the segments Y1 and Y1' of the aperture member 6, the alignment of the axis of the charged-particle beam 3 with the center of the aperture member 6 can be made automatically in the manner same as described above, by use of the differential amplifier 16 and the deflecting current controlling circuit 12.

It is however possible that the alignment of the axis of the charged-particle beam with respect to the center of the aperture member 6 by means of the combination of the aperture member 6 with the deflector 5 causes disadvantageous inclination of the axis of the charged-particle beam 3 as will be readily understood from FIG. 3. For this reason, according to the present embodiment, another set of an aperture stop member and a deflector are provided to prevent occurrence of such inclination of the axis of the charged-particle beam. More particularly, for this purpose, the second aperture member 8 is disposed below the first aperture member 6. Similarly to the first aperture member 6, the second aperture member 8 is divided into four fan-shaped segments X2, X2', Y2 and Y2' which are electrically isolated from each other. Four minute-current amplifiers 15—15, similar to those related to the first aperture member 6, are connected to the segments X2-Y2' of the second aperture member 8. Also, two differential amplifiers 18 and 19 are provided each of which is connected to corresponding two of the minute-current amplifiers 15—15. The output signals of the differential amplifiers 18 and 19 are supplied to deflecting current controlling circuits 14 and 13, respectively, thereby to control the deflecting action of the second deflector 7. As is best shown in FIG. 1, the second deflector 7 is disposed on or in close proximity to the plane of the first aperture member 6.

The position of the axis of the charged-particle beam 3 relative to the center of the second aperture member 8 can be detected by the differential amplifiers 18 and 19 in the same manner as has been described with reference to the first aperture member 6, and any deviation of the charged-particle beam 3 on the plane of the second aperture member 8 due to the inclination of the axis of the beam 3 can be corrected by controlling the deflecting action of the second deflector 7 in the same manner as has been described with reference to the first detector 5. So, as will be readily understood from FIG. 3, the inclination of the axis of the charged-particle beam 3 after passing through the first aperture member 6 can be eliminated by the co-operation of the second aperture member 8 and the second deflector 7. By this, the axis of the charged-particle beam 3 is fully aligned with a preset axis of the charged-particle beam apparatus. As a result, it is assured that the beam 3 of charged particles emitted from the apparatus impinges exactly upon an aimed or target position on the sample or workpiece 10 (FIG. 1).

While the invention has been described with reference to the illustrated embodiment, various modifications are possible within the scope of the invention. For example, while the automatic alignment portion comprising the aperture members 6 and 8 and the deflectors 5 and 7 is disposed, in the illustrated embodiments, between the condenser lens 4 and the objective lens 9, such automatic alignment portion may be disposed upstream of the condenser lens 4. Higher accuracy alignment of the charged-particle beam is attainable with such arrangement.

Also, while magnetic-field type deflectors are used in the illustrated embodiment, substantially the same effects are attainable by use of electrostatic type deflectors. Further, as for detection of the position of the axis of the charged-particle beam, secondary electrons and/or reflected electrons which will be produced at the time of incidence of the charged-particle beam upon the aperture member may be detected in addition to or in place of the absorbed electrons, by use of any suitable detecting means. Also, according to the arrangement of the present invention, the position of the axis of the charged-particle beam can be manually adjusted on the basis of the information obtainable from the aperture member.

While the invention has been described with reference to the structures disclosed herein, it is not confined to the details set forth and this application is intended to cover such modifications or changes as many come within the purposes of the improvements or the scope of the following claims.

What is claimed is:

1. A charged-particle beam apparatus, comprising:
   a source of a beam of charged particles;
   first deviation detecting means operable to detect, at a first position, any positional deviation of an axis of the charged-particle beam emitted from said source;
   first deflecting means operable, in accordance with the detection by said first deviation detecting means, to deflect the charged-particle beam so as to correct the positional deviation of the axis of the charged-particle beam at the first position;
   second deviation detecting means operable to detect, at a second position which is downstream of the first position with respect to a path of the charged-particle beam, any positional deviation of the axis of the charged-particle beam; and
   second deflecting means operable, in accordance with the detecting by said second detecting means, to deflect the charged-particle beam at the first position so as to correct the positional deviation of the axis of the charged-particle beam at the second position, so that the axis of the charged-particle beam passes said second deviation detecting means substantially without inclination.

2. An apparatus according to claim 1, wherein said first and second deviation detecting means include first and second stop members, respectively, disposed at said first and second positions, respectively, each of said first and second stop members having a plurality of electrode elements disposed in a ring-like fashion about the path of the charged-particle beam such that the deviation of the axis of the charged-particle beam is detected on the basis of an electric current caused in response to the impingement of the charged-particle beam upon said electrode elements.

3. A method of aligning a charged-particle beam, comprising:
   a first detecting step for detecting any positional deviation of an axis of the charged-particle beam at a first position;
   a first deflecting step for deflecting, in accordance with the detection at said first detecting step, the charged-particle beam so as to correct the positional deviation of the axis of the charged-particle beam at the first position;
   a second detecting step for detecting any positional deviation of the axis of the charged-particle beam at a second positional which is downstream of the first position with respect to a path of the charged-particle beam; and
   a second deflecting step for deflecting, substantially at the first position and in accordance with the detection by said second detecting step, the charged-particle beam so as to correct the positional deviation of the axis of the charged-particle beam at the second position, so that the axis of the charged-particle beam passes the second position substantially without inclination.

4. A charged-particle beam apparatus, comprising:
   a source of a beam of charged particles;
   a first detector disposed to receive the charged-particle beam from said source, for detecting the deviation of an axis of the received charged-particle beam;
   a first deflector for deflecting the charged-particle beam so as to correct the deviation detected by said first detector;
   a second detector disposed downstream of said first detector with respect to the path of the charged-particle beam, for receiving the charged-particle beam from said first deflector and for detecting deviation of the axis of the received charged-particle beam; and
   a second deflector disposed in close proximity to said first detector, for deflecting the charged-particle beam to correct the deviation detected by said second detector, so that the axis of the charged-particle beam passes said second detector substantially without inclination.

5. A charged-particle beam apparatus according to claim 4, wherein said first detector and said second deflector are disposed in substantially the same plane.

6. A charged-particle beam apparatus according to claim 4, wherein each of said first and second detectors includes a stop member having a plurality of electrode elements disposed in a ring-like fashion about the path of the charged-particle beam such that the deviation of the axis of the charged-particle beam is detected on the basis of an electric current caused in response to the impingement of the charged-particle beam upon said stop member.

7. A charged-particle beam apparatus, comprising:
   a source of a beam of charged particles;
   a first detector disposed to receive the charged-particle beam from said source, for detecting the deviation of an axis of the received charged-particle beam;
   a first deflector for deflecting the charged-particle beam so as to correct the deviation detected by said first detector; and
   inclination correcting means including a second detector disposed downstream of said first detector with respect to the path of the charged-particle beam, for receiving the charged-particle beam from said first deflector and for detecting inclination of the axis of the received charged-particle beam, and a second deflector disposed in close proximity to said first detector for deflecting the charged-particle beam so as to correct the inclination detected by said second detector.

8. A charged-particle beam apparatus according to claim 7, wherein said first detector and said second deflector are disposed in substantially the same plane.

9. A charged-particle beam apparatus according to claim 7, wherein each of said first and second detectors includes a stop member having a plurality of electrode elements disposed in a ring-like fashion about the path of the charged-particle beam such that the deviation of the axis of the charged-particle beam is detected on the basis of an electric current caused in response to the impingement of the charged-particle beam upon said stop member.

10. A charged-particle beam apparatus, comprising:
a source of a beam of charged particles;
adjusting means for adjusting the position of the charged-position beam from said source so that at a first position the charged-particle beam does not have a positional deviation;
deviation detecting means for detecting a positional deviation of the charged-particle beam at a second position which is downstream of the first position with respect to the path of the charged-particle beam; and
deflecting means for deflecting the charged-particle beam from said source, at a position which is in close proximity to the first position, on the basis of the detection by said deviation detecting means, to correct the positional deviation of the charged-particle beam at the second position, so that the axis of the charged-particle beam passes said deviation detecting means substantially without inclination.

11. A charged-particle beam apparatus according to claim 10, wherein said deflecting means is disposed in substantially the same plane as a plane passing through the first position.

12. A charged-particle beam apparatus according to claim 10, wherein said deviation detecting means includes a stop member having a plurality of electrode elements disposed in a ring-like fashion about the path of the charged-particle beam such that the deviation of the charged-particle beam is detected on the basis of an electric current caused in response to the impingement of the charged-particle beam upon said stop member.

13. A charged-particle beam apparatus, comprising:
a source of a beam of charged-particles;
first adjusting means for adjusting the position of the charged-particle beam from said source so that at a first position the charged-particle beam does not have a positional deviation; and
second adjusting means for adjusting the position of the charged-particle beam from said first adjusting means so that at a second position which is downstream of the first position with respect to the path of the charged-particle beam, the charged-particle beam does not have a positional deviation,
wherein said second adjusting means includes a deflector disposed in close proximity to the first position, for deflecting the charged-particle beam such that the axis of the charged-particle beam deflected by said deflector passes the second position substantially without inclination.

14. A charged-particle beam apparatus according to claim 13, wherein said deflector is disposed in substantially the same plane as a plane passing through the first position.

15. A charged-particle beam apparatus according to claim 13, wherein said second adjusting means includes a detector for detecting a positional deviation of the charged-particle beam at the second position, said detector having a plurality of electrode elements disposed in a ring-like fashion about the path of the charged-particle beam such that the deviation of the charged-particle beam is detected on the basis of an electric current caused in response to the impingement of the charged-particle beam upon said stop member.

* * * * *

UNITED STATES PATENT AND TRADEMARK OFFICE
CERTIFICATE OF CORRECTION

PATENT NO. : 4,939,371
DATED : July 3, 1990
INVENTOR(S) : SUSUMU GOTO

It is certified that error appears in the above-identified patent and that said Letters Patent is hereby corrected as shown below:

Title page:

AT [75] INVENTOR

"Susumo Goto," should read --Susumu Goto--.

COLUMN 1

Line 31, "gun) or an ion gun" should read
--gun or an ion gun)--.

COLUMN 5

Line 16, "many" should read --may--.
Line 68, "second positional" should read
--second position--.

COLUMN 7

Line 10, "charged-position beam" should read
--charged-particle beam--.

Signed and Sealed this

Thirtieth Day of July, 1991

Attest:

HARRY F. MANBECK, JR.

Attesting Officer

Commissioner of Patents and Trademarks